United States Patent
Oomori et al.

(10) Patent No.: US 6,255,041 B1
(45) Date of Patent: Jul. 3, 2001

(54) METHOD FOR FORMATION OF PATTERNED RESIST LAYER

(75) Inventors: Katsumi Oomori, Chigasaki; Hiroto Yukawa, Yokohama, both of (JP); Ryusuke Uchida, Hillsboro, OR (US); Kazufumi Sato, Sagamihara (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/291,114

(22) Filed: Apr. 14, 1999

(30) Foreign Application Priority Data

Apr. 23, 1998 (JP) .................................................. 10-113585

(51) Int. Cl.⁷ ....................................................... G03F 7/26
(52) U.S. Cl. ........................ 430/322; 430/270.1; 430/330
(58) Field of Search ................................. 430/311, 270.1, 430/330, 322

(56) References Cited

U.S. PATENT DOCUMENTS

| | | | |
|---|---|---|---|
| 5,565,304 | * 10/1996 | Honda | 430/311 |
| 5,585,223 | * 12/1996 | Frechet et al. | 430/296 |
| 5,660,969 | * 8/1997 | Kaimoto | 430/270.1 |
| 5,665,527 | * 9/1997 | Allen et al. | 430/325 |
| 5,679,495 | 10/1997 | Yamachika et al. | 430/191 |
| 5,683,857 | * 11/1997 | Shirai et al. | 430/326 |
| 5,728,506 | * 3/1998 | Kometani | 430/311 |
| 5,750,312 | * 5/1998 | Chandross et al. | 430/273.1 |
| 5,851,733 | * 12/1998 | Sezi et al. | 430/311 |
| 5,861,231 | 1/1999 | Barclay et al. | 430/270.1 |
| 5,879,857 | * 3/1999 | Chandross et al. | 430/270.1 |
| 6,045,972 | * 4/2000 | Salvin et al. | 430/280.1 |

FOREIGN PATENT DOCUMENTS

| | | |
|---|---|---|
| 0 596 668 | 5/1994 | (EP) . |
| 10-7650 | 1/1998 | (JP) . |

OTHER PUBLICATIONS

L. Schlegel et al., *J. Vac. Sci. Technol. B*, 9(2), 278–289 (1991).

* cited by examiner

*Primary Examiner*—Kathleen Duda
(74) *Attorney, Agent, or Firm*—Wenderoth, Lind & Ponack, L.L.P.

(57) ABSTRACT

Disclosed is a method for forming an extremely finely patterned resist layer on a substrate surface by using a positive-working chemical-amplification photoresist composition in the manufacturing process of semiconductor devices. The method for the formation of a patterned resist layer comprises the steps of: (1) forming, on a substrate, a layer of a photoresist composition comprising: (A) a copolymeric resin consisting of (a) from 50 to 85% by moles of hydroxyl group-containing styrene units, (b) from 15 to 35% by moles of styrene units and (c) from 2 to 20% by moles of acrylate or methacrylate ester units each having a solubility-reducing group capable of being eliminated in the presence of an acid; and (B) a radiation-sensitive acid-generating agent which is an onium salt containing a fluoroalkyl sulfonate ion having 1 to 10 carbon atoms as the anion such as bis(4-tert-butylphenyl) iodonium nonafluorobutane sulfonate; (2) subjecting the photoresist layer to a first heat treatment at a temperature in the range from 120° C. to 140° C.; (3) subjecting the photoresist layer to patternwise exposure to light; (4) subjecting the photoresist layer to a second heat treatment at a temperature in the range from 110° C. to 130° C. but lower than the temperature of the first heat treatment; and (5) subjecting the photoresist layer to a development treatment.

10 Claims, No Drawings

METHOD FOR FORMATION OF PATTERNED RESIST LAYER

BACKGROUND OF THE INVENTION

The present invention relates to a method for the formation of a patterned resist layer or, more particularly, to an efficient method for the formation of a very finely patterned resist layer of high fidelity to the photomask pattern having an excellently orthogonal cross sectional profile with high photosensitivity on a substrate surface by using a positive-working chemical-amplification photoresist composition.

As a trend in the manufacturing technology of semiconductor devices and liquid crystal display panels in recent years, extensive investigations are now under way to establish a photolithographic patterning process of a resist layer having a pattern resolution of as fine as 0.25 µm or even finer by the use of a positive-working chemical-amplification photoresist composition. Turning now to the problem of the light source for the pattern-wise exposure of the photoresist layer to comply with the requirement in the manufacture of semiconductor devices to accomplish finer and finer patterning, a photolithographic patterning technology for obtaining a patterned resist layer of 0.15 to 0.22 µm fineness by using a KrF excimer laser beam is the current target of the development works.

With an object to comply with the above mentioned requirements, a proposal is made in Japanese Patent Kokai 7-209868 for a positive-working chemical-amplification photoresist composition containing, as the film-forming resinous ingredient, a copolymeric resin consisting of hydroxyl group-containing styrene units, styrene units and tert-butyl (meth)acrylate units in a molar ratio of 40:20:40 or 33:17:50. The there proposed photoresist composition using a copolymeric resin with a relatively small amount of the hydroxyl group-containing styrene units or a relatively large amount of the tert-butyl (meth)acrylate units is not quite satisfactory when an extremely fine patterned resist layer of 0.15 to 0.22 µm fineness is formed therewith because the cross sectional profile of the patterned resist layer is not fully orthogonal as desired.

In the photolithographic patterning technology, studies have been made on the temperatures in the drying heat treatment or, namely, pre-exposure baking treatment of the coating layer of the photoresist composition as applied to the substrate surface and the post-exposure baking treatment after pattern-wise exposure of the resist layer to light. It is known that the pre-exposure baking treatment is undertaken preferably at a temperature higher than the temperature in the post-exposure baking treatment (see, for example, Journal of Vacuum Science and Technology, 278, March/April, 1991). This teaching, however, is not applicable to various types of photoresist compositions because the studies reported there were conducted by using a positive-working photoresist composition comprising a novolak resin and a polyhydroxystyrene resin of which a part of the hydroxy groups were substituted by tetrahydropyranyl groups, which necessarily had low transmissivity to ultraviolet light giving only a limited critical pattern resolution.

Japanese Patent No. 2688188 teaches a photolithographic patterning method in which the pre-exposure baking treatment is conducted at a temperature not lower than the glass transition temperature of the resinous ingredient by more than about 20° C. but not exceeding the scission temperature of the acid-labile groups and the post-exposure baking treatment is conducted at a temperature of about 110° C. or higher. In this method, however, the temperature of the post-exposure baking treatment is not necessarily lower than the temperature of the pre-exposure baking treatment so as not to attain a pattern resolution of 0.22 µm or finer.

In recent years, on the other hand, onium salts or, in particular, those containing sulfonate ions as the anion are highlighted as an acid-generating agent used in positive-working chemical-amplification photoresist compositions. Examples of such an onium salt as the acid-generating agent in a positive-working chemical-amplification photoresist composition heretofore proposed include onium salts containing a fluoroalkyl sulfonate ion and having at least one acid-instabilizable group on the phenyl group in the molecule such as 2,2,2-trifluoroethane sulfonic acid (4-tert-butoxyphenyl) diphenyl sulfonium as disclosed in Japanese Patent Kokai 10-7650.

The onium salts having an acid-instabilizable group in the molecule, however, are defective due to their low solubility in the organic solvent of the photoresist solutions to limit the amount thereof in the photoresist solution resulting in a decreased photosensitivity and low storage stability of the photoresist solution. In addition, the acid-instabilizable group is liable to be decomposed when the pre-exposure baking treatment or, namely, heat-drying of the photoresist layer formed by coating is performed at 120° C. or higher eventually to lose the activity as an acid-generating agent.

SUMMARY OF THE INVENTION

The present invention accordingly has an object to provide an efficient method capable of forming a very finely patterned resist layer of high fidelity to the photomask pattern having an excellently orthogonal cross sectional profile by using a positive-working chemical-amplification photoresist composition with high photosensitivity.

Thus, the method of the present invention for the formation of a patterned resist layer on a substrate surface comprises the steps of:

(1) forming, on the surface of a substrate, a coating layer of a positive-working chemical-amplification photoresist composition comprising, as a uniform solution in an organic solvent:
  (A) 100 parts by weight of a copolymeric resin consisting of (a) from 50 to 85% by moles of hydroxyl group-containing styrene units, (b) from 15 to 35% by moles of styrene units and (c) from 2 to 20% by moles of acrylate or methacrylate ester units each having a solubility-reducing group capable of being eliminated in the presence of an acid, the total of the molar fractions of the monomeric units (a), (b) and (c) being 100%; and
  (B) from 1 to 20 parts by weight of a radiation-sensitive acid-generating agent which is an onium salt containing a fluoroalkyl sulfonate ion having 1 to 10 carbon atoms as the anion;

(2) subjecting the coating layer to a first baking treatment at a temperature in the range from 120° C. to 140° C. for 30 to 150 seconds;

(3) exposing the coating layer pattern-wise to actinic rays;

(4) subjecting the coating layer to a second baking treatment for 30 to 150 seconds at a temperature in the range from 110° C. to 130° C. but lower, by at least 10° C., than the temperature of the first baking treatment in step (2); and (5) subjecting the coating layer to a development treatment.

In particular, the above mentioned solubility-reducing group capable of being eliminated by interacting with an acid forming the (meth)acrylate ester units in the component (A) is selected preferably from the group consisting of tertiary alkyl groups, 1-alkoxyalkyl groups and acetal groups. Further, the anion forming the onium salt as the component (B) is preferably a nonafluorobutane sulfonate ion.

DETAILED DESCRIPTION OF THE PREFERRED EMBODIMENTS

The base ingredient as the component (A) in the photoresist composition used in the inventive method is a ternary copolymeric resin consisting of three kinds of the monomeric units including (a) from 50 to 85% by moles of hydroxyl group-containing styrene units, (b) from 15 to 35% by moles of styrene units and (c) from 2 to 20% by moles of acrylate or methacrylate ester units each having a solubility-reducing group capable of being eliminated in the presence of an acid, the total of the molar fractions of the monomeric units (a), (b) and (c) being 100%. In this ternary copolymeric resin as the component (A), the monomeric unit of the first type (a) is a unit derived from a styrene monomer having at least one hydroxyl group in the molecule in order to impart the copolymeric resin with good solubility in an aqueous alkaline solution as the developer solution. Examples of such a monomeric unit include a hydroxystyrene unit and α-methyl hydroxystyrene unit.

The monomeric unit of the third type (c) in the copolymeric resin has a carboxyl group substituted by a group capable of exhibiting a reducing effect on the solubility of the resin in an aqueous alkaline solution while this protective group can be eliminated from the carboxyl group by the interaction of an acid generated from the acid-generating agent as the component (B) when the photoresist layer is exposed pattern-wise to actinic rays to form an unsubstituted carboxyl group resulting in an increase of solubility of the resin in an aqueous alkaline solution to give a patterned resist layer in the development treatment with an aqueous alkaline developer solution.

The solubility-reducing group capable of being eliminated by interacting with an acid in the monomeric units of the third type (c) can be any one of known protective groups either singly or as a combination of two kinds or more including tertiary alkyl groups such as tert-butyl and tert-pentyl groups, 1-alkoxyalkyl groups such as 1-ethoxyethyl and 1-methoxypropyl groups and acetal groups such as tetrahydrofuranyl and tetrahydropyranyl groups as preferable ones.

The monomeric unit of the third type (c) is a unit introduced by the copolymerization of a (meth)acrylate ester monomer. This monomeric unit is represented by the general formula

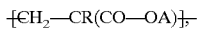

in which R is a hydrogen atom or a methyl group and A is the acid-dissociable solubility-reducing group including tertiary alkyl groups such as tert-butyl group and tert-pentyl group, 1-alkoxyalkyl groups such as 1-ethoxyethyl group and 1-methoxypropyl group and acetal groups such as tetrahydropyranyl group and tetrahydrofuranyl group, of which tert-butyl group, 1-ethoxyethyl group and tetrahydropyranyl group are preferred.

The monomeric unit of the third type (c) is preferably a unit derived from a monomer compound selected from the group consisting of tert-butyl (meth)acrylate, 1-ethoxyethyl (meth)acrylate and tetrahydropyranyl (meth)acrylate in respect of the high susceptibility to acid-induced dissociation to give a patterned resist layer having an excellent cross sectional profile.

The copolymeric resin as the component (A), which consists of the monomeric units of the three types (a), (b) and (c) in a specified molar proportion, is advantageous as compared with a resin having solubility-reducing groups introduced into a part of the monomeric units of a polyhydroxystyrene resin in respect of the larger solubility-reducing effect and smaller thickness reduction of the resist layer by a development treatment in the unexposed areas to give a patterned resist layer having a good cross sectional profile.

In the positive-working photoresist composition used in the inventive method comprising the copolymeric resinous ingredient as the component (A), which can be either one or a combination of two kinds or more of copolymeric resins falling within the definition of the above described ternary copolymeric resins, it is preferable that the component (A) is a combination of a first copolymeric resin consisting of from 62 to 68% by moles of the monomeric units of the first type (a), from 15 to 25% by moles of the monomeric units of the second type (b) and from 12 to 18% by moles of the monomeric units of the third type (c) and a second copolymeric resin consisting of from 62 to 68% by moles of the monomeric units of the first type (a), from 25 to 35% by moles of the monomeric units of the second type (b) and from 2 to 8% by moles of the monomeric units of the third type (c) in a weight proportion in the range from 9:1 to 5:5 or, more preferably, from 8:2 to 6:4 in respect of the superiority in the photosensitivity, pattern resolution and orthogonality of the cross sectional profile of the patterned resist layer.

It is preferable that the copolymeric resin as the component (A) has a weight-average molecular weight in the range from 3000 to 30000 as determined by the gel permeation chromatographic (GPC) method by making reference to known polystyrene resins. When the weight-average molecular weight of the component (A) is too low, the photoresist composition cannot be fully film-forming while, when the weight-average molecular weight of the resin is too high, the resin cannot be fully soluble in an aqueous alkaline solution.

The component (B) contained in the positive-working photoresist composition in combination with the above described component (A) used in the inventive method is a radiation-sensitive acid-generating agent which is a compound capable of releasing an acid by decomposition under irradiation with actinic rays such as ultraviolet light. It is preferable that the acid-generating agent in the photoresist composition is an onium salt compound containing a fluoroalkyl sulfonate ion of 1 to 10 carbon atoms as the anion.

The cation as the counter ion of the above mentioned anion of the onium salt compound is not particularly limitative and can be selected from known ones. Suitable cations include, for example, phenyl iodonium and sulfonium ions which may optionally be substituted by a lower alkyl group such as methyl, ethyl, propyl, n-butyl and tert-butyl groups or a lower alkoxy group such as methoxy and ethoxy groups.

On the other hand, the anion of the onium salt compound is a fluoroalkyl sulfonate ion obtained by substituting fluorine atoms for a part or all of the hydrogen atoms in an alkyl group of 1 to 10 carbon atoms. It is preferable that the alkyl group in the fluoroalkyl sulfonate ion has 1 to 5 carbon atoms and all of the hydrogen atoms thereof are substituted by fluorine atoms since the acid strength of the sulfonate ion as a sulfonic acid is decreased as the chain length of the alkyl group is increased and the degree of fluorination of the alkyl group is decreased.

Examples of suitable onium salt compounds as the component (B) include:

iodonium salt compounds represented by the general formula

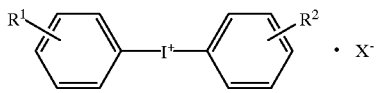

in which $R^1$ and $R^2$ are each, independently from the other, a hydrogen atom, alkyl group having 1 to 4 carbon atoms or alkoxy group having 1 or 2 carbon atoms and $X^-$ is a fluoroalkyl sulfonate ion of 1 to 10 carbon atoms; and sulfonium salt compounds represented by the general formula

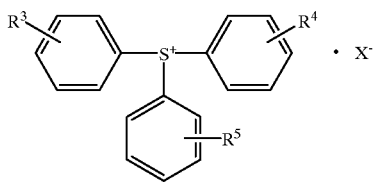

in which $R^3$, $R^4$ and $R^5$ are each, independently from the others, a hydrogen atom, alkyl group having 1 to 4 carbon atoms or alkoxy group having 1 or 2 carbon atoms and $X^-$ has the same meaning as defined above.

Particular examples of the onium salt compounds suitable as the component (B) in the positive-working photoresist composition include diphenyl iodonium trifluoromethane sulfonate, diphenyl iodonium nonafluorobutane sulfonate, bis(4-tert-butylphenyl) iodonium trifluoromethane sulfonate, bis(4-tert-butylphenyl) iodonium nonafluorobutane sulfonate, triphenyl sulfonium trifluoromethane sulfonate, triphenyl sulfonium nonafluorobutane sulfonate, tri(4-methylphenyl) sulfonium trifluoromethane sulfonate and tri(4-methylphenyl) sulfonium nonafluorobutane sulfonate, of which bis(4-tert-butylphenyl) iodonium trifluoromethane sulfonate and bis(4-tert-butylphenyl) iodonium nonafluorobutane sulfonate are particularly preferable although any of the above named onium salt compounds can be used either singly or as a combination of two kinds or more according to need.

The amount of the onium salt compound as the component (B) in the photoresist composition is in the range from 1 to 20 parts by weight per 100 parts by weight of the component (A). When the amount of the component (B) is too small, good pattern formation can hardly be accomplished while, when the amount of the component (B) is too large, a photoresist composition in the form of a uniform solution cannot be obtained due to the limited solubility of the compound in an organic solvent.

While the essential ingredients in the positive-working photoresist composition used in the inventive method are the above described components (A) and (B), it is optional, if necessary with an object to improve the fidelity of the resist pattern to the photomask pattern by preventing diffusion of the acid released by pattern-wise exposure of the resist layer to actinic rays more than necessary, that the photoresist composition further contains a secondary or tertiary amine compound as a component (C). Examples of preferable secondary amine compounds include aliphatic secondary amines such as diethylamine, dipropylamine, dibutylamine and dipentylamine. Examples of preferable tertiary amine compounds include aliphatic tertiary amines such as trimethylamine, triethylamine, tripropylamine, tributylamine, tripentylamine, N,N-dimethyl propylamine and N-ethyl-N-methyl butylamine, aliphatic tertiary alkanolamine compounds such as N,N-dimethyl monoethanolamine, N,N-diethyl monoethanolamine and triethanolamine and aromatic tertiary amine compounds such as N,N-dimethylaniline, N,N-diethylaniline, N-ethyl-N-methylaniline, N,N-dimethyltoluidine, N-methyl diphenylamine, N-ethyl diphenylamine and triphenylamine, of which aliphatic tertiary $C_2$ to $C_4$ alkanolamine compounds such as triethanolamine are particularly preferable although any of these amine compounds can be used either singly or as a combination of two kinds or more according to need.

While additional admixture of the above mentioned amine compound with the photoresist composition may eventually cause a disadvantage of a decrease in the photosensitivity of the composition, this disadvantage can be overcome, along with a beneficial effect of improving the pattern resolution, by the admixture of a carboxylic acid as a component (D) in combination with the component (C). Preferable carboxylic acids suitable for this purpose include aliphatic saturated carboxylic acids, alicyclic carboxylic acids and aromatic carboxylic acids.

Examples of suitable aliphatic saturated carboxylic acids include butyric, isobutyric, malonic, succinic, glutaric and adipic acids. Examples of suitable alicyclic carboxylic acids include 1,1-cyclohexane dicarboxylic acid, 1,2-cyclohexane dicarboxylic acid, 1,3-cyclohexane dicarboxylic acid, 1,4-cyclohexane dicarboxylic acid and cyclohexane 1,1-diacetic acid. Examples of suitable aromatic carboxylic acids include aromatic monocarboxylic acids having a hydroxyl or nitro group as a substituent group and aromatic polycarboxylic acids such as 2-, 3- and 4-hydroxy benzoic acids, 2-hydroxy-3-nitro benzoic acid, phthalic acid, terephthalic acid and isophthalic acid. These carboxylic acids can be used either singly or as a combination of two kinds or more according to need, although the aromatic carboxylic acids are preferable due to the adequate acid strength thereof and 2-hydroxy benzoic acid is more preferable because this compound has high solubility in the organic solvent for the photoresist composition and a patterned resist layer of high quality can be formed on substrates of various materials from the photoresist composition containing this acid.

As to the amount of the optional component (C) in the photoresist composition, the amine compound is added to the composition in an amount in the range from 0.001 to 10 parts by weight or, preferably, from 0.01 to 1.0 part by weight per 100 parts by weight of the component (A). Addition of the component (C) in an adequate amount to the photoresist composition has an effect of preventing more than necessary diffusion of the acid generated by exposure of the resist layer to actinic rays so as to improve the fidelity of the resist pattern to the photomask pattern.

The amount of the carboxylic acid as the component (D), when added to the photoresist composition, is in the range from 0.001 to 10 parts by weight or, preferably, from 0.01 to 1.0 part by weight per 100 parts by weight of the component (A). Addition of the component (D) to the photoresist composition has an effect of preventing a decrease in the photosensitivity of the composition as a side effect of the component (C) along with a further improvement of the pattern resolution.

It is usual and advantageous that the positive-working chemical-amplification photoresist composition used in the method of the present invention is employed in photolithographic patterning works in the form of a uniform solution prepared by dissolving the essential and optional ingredients in an organic solvent. Examples of suitable organic solvents include ketones such as acetone, methyl ethyl ketone, cyclohexanone, methyl isoamyl ketone and 2-heptanone, polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof, cyclic ethers such as dioxane and esters such as methyl lactate, ethyl lactate, methyl acetate, ethyl acetate, butyl acetate, methyl pyruvate, ethyl pyruvate, methyl methoxypropionate and ethyl ethoxypropionate, which can be used either singly or as a mixture of two kinds or more according to need.

It is of course optional that the photoresist composition used in the method of the invention is further admixed with various kinds of known additives used conventionally in photoresist compositions including auxiliary resins to improve the properties of the resist layer as a film, plasticizers, stabilizers, coloring agents, surface active agents and others each in a limited amount.

The patterns of the photolithographically formed resist layers in the semiconductor technology can be classified into three types including (1) a line-and-space pattern which is an alternate repetition of parallel lines and parallel spaces each having the same width as the others, (2) a hole pattern to form a contact hole and (3) an isolated pattern which is a repetition of lines and spaces, the spaces each having a width larger than the width of each line.

It is extremely difficult in the prior art to accomplish an ultrafinely patterned resist layer including the above mentioned three types of patterns (1), (2) and (3) simultaneously with fineness of 0.15 to 0.22 $\mu$m so that it is becoming more and more important to develop a photolithographic patterning method to meet the requirements in the respective applications. Under these circumstances, the present invention provides a photolithographic patterning method which satisfies the requirements for patterned resist layers of a line-and-space pattern and a hole pattern having fineness of 0.20 to 0.22 $\mu$m.

In the inventive method for the photolithographic formation of a patterned resist layer by using a positive-working photoresist composition, it is advantageous that the surface of the substrate such as a semiconductor silicon wafer is subjected beforehand to a treatment with hexamethyl disilazane and the like to improve adhesion of the resist layer to the substrate surface. The positive-working photo-resist composition in the form of a solution is uniformly applied to the substrate surface on a coating machine such as a spinner followed by drying or a pre-exposure baking treatment to form a dried photoresist layer. In the present invention, this pre-exposure baking treatment is conducted prior to pattern-wise exposure to actinic rays at a temperature in the range from 120 to 140° C. or, preferably, from 130 to 140° C. for 30 to 150 seconds or, preferably, from 60 to 120 seconds.

In the next place, the dried photoresist layer after the pre-exposure baking treatment is pattern-wise exposed to actinic rays such as KrF excimer laser beams through a photomask bearing a desired pattern, for example, on a minifying projection exposure machine followed by a baking treatment to form a latent image of the pattern. This post-exposure baking treatment is conducted at a temperature in the range from 110 to 130° C. for 30 to 150 seconds or, preferably, from 60 to 120 seconds with the proviso that the temperature of the post-exposure baking treatment is lower than the temperature of the pre-exposure baking treatment, desirably, by at least 10° C. Development of the latent image is performed by using an aqueous alkaline solution such as a 1 to 10% aqueous solution of tetramethylammonium hydroxide.

By conducting the pre-exposure and post-exposure baking treatments at temperatures within the above mentioned respective temperature ranges, an extremely fine patterned resist layer of high fidelity to the photomask pattern can be formed on the substrate surface by virtue of the controlled diffusing distance of the acid generated by exposure of the resist layer to light with a fineness of 0.20 to 0.22 $\mu$m and a cross sectional profile of good orthogonality.

When the desired resist pattern is a hole pattern, in particular, it is advantageous that the photoresist composition is admixed with dimethylacetamide in an amount of 0.1 to 5.0 parts by weight per 100 parts by weight of the component (A).

In the following, the method of the present invention is described in more detail by way of Examples, which, however, never limit the scope of the invention in any way. In the following description, the term of "parts" always refers to "parts by weight".

EXAMPLE 1

A positive-working photoresist composition was prepared by uniformly dissolving, in 800 parts of propyleneglycol monoethyl ether acetate, 60 parts of a first copolymeric resin, referred to as the resin I hereinafter, having a weight-average molecular weight of 10,000 and consisting of 65% by moles of hydroxystyrene units, 20% by moles of styrene units and 15% by moles of tertbutyl acrylate units, 40 parts of a second copolymeric resin, referred to as the resin II hereinafter, having a weight-average molecular weight of 10,000 and consisting of 65% by moles of hydroxystyrene units, 30% by moles of styrene units and 5% by moles of tertbutyl acrylate units, 5 parts of triphenylsulfonium trifluoromethane sulfonate 0.5 part of triethanolamine, and 0.5 part of salicylic acid, followed by filtration of the solution through a membrane filter of 0.2 $\mu$m pore diameter.

A semiconductor silicon wafer of 6 inches diameter after a treatment with hexamethyl disilazane was coated on a spinner with the above prepared photoresist solution followed by drying under heating on a hot plate at 130° C. for 90 seconds to give a dried photoresist layer having a thickness of 0.7 $\mu$m. In the next place, the photoresist layer was exposed pattern-wise to a KrF excimer laser beam on a minifying projection exposure machine (Model FPA-3000EX3, manufactured by Canon Co.) followed by a post-exposure baking treatment at 110° C. for 90 seconds and then by a puddle development treatment at 23° C. for 65 seconds in a 2.38% by weight aqueous solution of tetramethylammonium hydroxide to give a positively patterned resist layer.

A fully resolved line-and-space pattern of 0.22 $\mu$m line width could be obtained in this way. The thus patterned resist layer had an excellently orthogonal cross sectional profile standing upright on the substrate surface. The minimum exposure dose for obtaining the line-and-space resist pattern of 0.22 $\mu$m width was 30 mJ/cm$^2$ as a measure of the photosensitivity.

EXAMPLE 2

The experimental procedure was substantially the same as in Example 1 excepting for modification of the formulation of the photoresist composition by replacing triphenylsulfonium trifluoromethane sulfonate with the same amount of bis(4-tert-butylphenyl) iodonium nonafluorobutane sulfonate and for an increase of the post-exposure baking treatment temperature from 110° C. to 120° C.

The results of the evaluation tests of the patterned resist layer were that a line-and-space pattern of 0.22 µm line width could be obtained in this way. The thus patterned resist layer had an excellently orthogonal cross sectional profile standing upright on the substrate surface. The minimum exposure dose for obtaining the line-and-space resist pattern of 0.22 µm width was 30 mJ/cm$^2$ as a measure of the photosensitivity. The critical pattern resolution was 0.19 µm.

EXAMPLE 3

The experimental procedure was substantially the same as in Example 1 excepting for modification of the formulation of the photoresist composition by increasing the amount of the resin I from 60 parts to 80 parts, decreasing the amount of the resin II from 40 parts to 20 parts and additional admixture of the composition with 0.2 part of dimethylacetamide and for an increase of the pre-exposure baking temperature and post-exposure baking temperature from 130° C. to 140° C. and from 110° C. to 130° C., respectively.

The results of the evaluation tests of the patterned resist layer were that a hole pattern of 0.22 µm diameter could be obtained in this way. The thus formed hole pattern had an excellent cross sectional profile perpendicularly reaching the substrate surface. The minimum exposure dose for obtaining the resist pattern of 0.22 µm was 40 mJ/cm$^2$ as a measure of the photosensitivity.

EXAMPLE 4

The experimental procedure was substantially the same as in Example 3 excepting for modification of the formulation of the photoresist composition by replacing triphenylsulfonium trifluoromethane sulfonate with the same amount of bis(4-tert-butylphenyl) iodonium nonafluorobutane sulfonate.

The results of the evaluation tests of the patterned resist layer were that a hole pattern of 0.20 µm diameter could be obtained in this way. The thus formed hole pattern had an excellent cross sectional profile perpendicularly reaching the substrate surface. The minimum exposure dose for obtaining the hole pattern of 0.20 µm was 40 mJ/cm$^2$ as a measure of the photosensitivity. The critical pattern resolution was 0.19 µm.

COMPARATIVE EXAMPLE 1

The experimental procedure was substantially the same as in Example 1 excepting for a decrease of the pre-exposure baking temperature from 130° C. to 110° C.

The results of the evaluation tests of the patterned resist layer were that line-and-space patterns of a line width smaller than 0.25 µm could not be obtained although the thus patterned resist layer had an orthogonal cross sectional profile standing upright on the substrate surface. The minimum exposure dose for obtaining the line-and-space resist pattern of 0.25 µm width was 100 mJ/cm$^2$ as a measure of the photosensitivity.

COMPARATIVE EXAMPLE 2

The experimental procedure was substantially the same as in Example 1 excepting for a decrease of the pre-exposure baking temperature from 130° C. to 110° C. and an increase of the post-exposure baking temperature from 110° C. to 120° C.

The results of the evaluation tests of the patterned resist layer were that line-and-space patterns of a line width smaller than 0.25 µm could not be obtained and the cross sectional profile of a line-patterned resist layer of 0.25 µm width was trapezoidal. The minimum exposure dose for obtaining the line-and-space pattern of 0.25 µm line width was 80 mJ/cm$^2$.

COMPARATIVE EXAMPLE 3

The experimental procedure was substantially the same as in Example 3 excepting for an increase of the pre-exposure baking temperature and post-exposure baking temperature from 140° C. to 150° C. and from 130° C. to 150° C., respectively.

As the results of the evaluation tests of the patterned resist layer, no patterned resist layer could be obtained.

COMPARATIVE EXAMPLE 4

The experimental procedure was substantially the same as in Example 3 excepting for an increase of the pre-exposure baking temperature from 140° C. to 180° C. and a decrease of the post-exposure baking temperature from 130° C. to 110° C.

The results of the evaluation tests of the patterned resist layer were that line-and-space patterns of a line width smaller than 0.50 µm could not be obtained and the cross sectional profile of a line-patterned resist layer of 0.50 µm width was trapezoidal. The minimum exposure dose for obtaining the line-and-space pattern of 0.50 µm line width was 80 mJ/cm$^2$.

What is claimed is:

1. A method for the formation of a patterned resist layer on a substrate surface which comprises the steps of:
    (1) forming, on the surface of a substrate, a coating layer of a positive-working chemical-amplification photoresist composition comprising, as a uniform solution in an organic solvent:
        (A) a copolymeric resin consisting of (a) from 50 to 85% by moles of hydroxyl group-containing styrene units, (b) from 15 to 35% by moles of styrene units and (c) from 2 to 20% by moles of acrylate or methacrylate ester units each having a solubility-reducing group capable of being eliminated in the presence of an acid, the total of the molar fractions of the monomeric units (a), (b) and (c) being 100%; and
        (B) a radiation-sensitive acid-generating agent which is an onium salt containing a fluoroalkyl sulfonate ion having 1 to 10 carbon atoms as the anion;
    (2) subjecting the coating layer to a first heat treatment at a temperature in the range from 120° C. to 140° C.
    (3) exposing the coating layer pattern-wise to actinic rays;
    (4) subjecting the coating layer to a second heat treatment at a temperature in the range from 110° C. to 130° C., the temperature of the second heat treatment being lower than the temperature of the first heat treatment; and
    (5) subjecting the coating layer to a development treatment.

2. The method for the formation of a patterned resist layer as claimed in claim 1 in which the first heat treatment is conducted for 30 to 150 seconds.

3. The method for the formation of a patterned resist layer as claimed in claim 1 in which the second heat treatment is conducted for 30 to 150 seconds.

4. The method for the formation of a patterned resist layer as claimed in claim 1 in which the temperature of the second heat treatment is lower than the temperature of the first heat treatment by at least 10° C.

5. The method for the formation of a patterned resist layer as claimed in claim 1 in which the solubility-reducing group capable of being eliminated in the presence of an acid is selected from the group consisting of tertiary alkyl groups, 1-alkoxyalkyl groups and acetal groups.

6. The method for the formation of a patterned resist layer as claimed in claim 5 in which the tertiary alkyl group is tert-butyl group.

7. The method for the formation of a patterned resist layer as claimed in claim 5 in which the 1-alkoxyalkyl group is 1-ethoxyethyl group.

8. The method for the formation of a patterned resist layer as claimed in claim 5 in which the acetal group is tetrahydropyranyl group.

9. The method for the formation of a patterned resist layer as claimed in claim 1 in which the component (A) is a combination of a first copolymeric resin consisting of from 62 to 68% by moles of the monomeric units (a), from 15 to 25% by moles of the monomeric units (b) and from 12 to 18% by moles of the monomeric units (c) and a second copolymeric resin consisting of from 62 to 68% by moles of the monomeric units (a), from 25 to 35% by moles of the monomeric units (b) and from 2 to 8% by moles of the monomeric units (c) in a weight proportion in the range from 9:1 to 5:5.

10. The method for the formation of a patterned resist layer as claimed in claim 1 in which the component (B) is an onium salt compound having a trifluoromethane sulfonic acid ion or nonafluorobutane sulfonic acid ion as the anion.

* * * * *